United States Patent
DeBrosse et al.

(10) Patent No.: US 9,799,386 B1
(45) Date of Patent: Oct. 24, 2017

(54) STT MRAM MIDPOINT REFERENCE CELL ALLOWING FULL WRITE

(71) Applicant: International Business Machines Corporation, Armonk, NY (US)

(72) Inventors: John K. DeBrosse, Colchester, VT (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/251,466

(22) Filed: Aug. 30, 2016

(51) Int. Cl.
G11C 11/16 (2006.01)
H01L 23/528 (2006.01)
H01L 43/08 (2006.01)
H01L 27/22 (2006.01)

(52) U.S. Cl.
CPC ......... *G11C 11/1675* (2013.01); *G11C 11/16* (2013.01); *G11C 11/1673* (2013.01); *H01L 23/528* (2013.01); *H01L 27/228* (2013.01); *H01L 43/08* (2013.01)

(58) Field of Classification Search
CPC ............................. G11C 11/16; G11C 13/0069
USPC .................................................. 365/158, 173
See application file for complete search history.

(56) References Cited

U.S. PATENT DOCUMENTS

| | | | |
|---|---|---|---|
| 6,600,690 B1 | 7/2003 | Nahas et al. | |
| 6,946,882 B2 | 9/2005 | Gogl et al. | |
| 7,099,122 B2* | 8/2006 | Yi | G11B 5/39 360/324.1 |
| 7,286,395 B2* | 10/2007 | Chen | G11C 11/16 365/158 |
| 7,379,327 B2* | 5/2008 | Chen | G11C 11/16 365/158 |
| 7,999,337 B2* | 8/2011 | Zheng | G11C 11/16 257/421 |
| 8,400,823 B2* | 3/2013 | Xi | G11C 11/16 365/148 |
| 8,446,757 B2* | 5/2013 | DeBrosse | G11C 11/16 365/148 |

(Continued)

OTHER PUBLICATIONS

Zhao et al., "Architecting a common-source-line array for bipolar non-volatile memory devices," 2012 Design, Automation & Test in Europe Conference & Exhibition (DATE), pp. 1451-1454 (Mar. 2012).

(Continued)

*Primary Examiner* — Michael Tran
(74) *Attorney, Agent, or Firm* — Vazken Alexanian; Michael J. Chang, LLC (57) ABSTRACT

Improved STT MRAM midpoint reference cell configurations are provided. In one aspect, a STT MRAM midpoint reference cell includes: a plurality of word lines having at least one write reference word line and at least one read reference word line; a plurality of bit lines perpendicular to the word lines; at least one source line perpendicular to the bit lines; at least one first magnetic tunnel junction in series with i) a first field effect transistor gated by the write reference word line and ii) a second field effect transistor gated by the read reference word line; and at least one second magnetic tunnel junction in series with iii) a third field effect transistor gated by the write reference word line and iv) a fourth field effect transistor gated by the read reference word line. A method of operating a STT MRAM midpoint reference cell is also provided.

19 Claims, 8 Drawing Sheets

(56) References Cited

U.S. PATENT DOCUMENTS

| | | | | |
|---|---|---|---|---|
| 9,224,447 B2* | 12/2015 | Wang | .................. | G11C 11/16 |
| 9,343,131 B1 | 5/2016 | DeBrosse | | |
| 9,362,336 B2* | 6/2016 | Lu | .................. | H01L 27/222 |
| 9,391,262 B1* | 7/2016 | Nikonov | .................. | H01L 43/04 |
| 2008/0019192 A1* | 1/2008 | Wang | .................. | G11C 7/062 |
| | | | | 365/189.06 |
| 2008/0266943 A1* | 10/2008 | Yang | .................. | G11C 11/16 |
| | | | | 365/171 |
| 2009/0146131 A1* | 6/2009 | Happ | .................. | H01L 27/222 |
| | | | | 257/5 |
| 2009/0161423 A1* | 6/2009 | Sugibayashi | .................. | G11C 11/15 |
| | | | | 365/171 |
| 2009/0201717 A1* | 8/2009 | Maeda | .................. | G11C 11/16 |
| | | | | 365/148 |

OTHER PUBLICATIONS

Na et al., "Reference-Scheme Study and Novel Reference Scheme for Deep Submicrometer STT-RAM," IEEE Transactions on Circuits and Systems—I: Regular Papers, vol. 61, No. 12, pp. 3376-3385 (Dec. 2014).
List of IBM Patents or Applications Treated as Related.

\* cited by examiner

STT MRAM MIDPOINT REFERENCE CELL ALLOWING FULL WRITE

FIELD OF THE INVENTION

The present invention relates to Spin Torque Transfer (STT) Magnetoresistive Random Access Memory (MRAM), and more particularly, to improved STT MRAM midpoint reference cell configurations which permit reference cells to be written under conditions identical to that of writing a data cell.

BACKGROUND OF THE INVENTION

Spin Torque Transfer (STT) Magnetoresistive Random Access Memory (MRAM) is an attractive emerging memory technology, offering non-volatility, high performance, and high endurance. An STT MRAM memory cell generally includes a Magnetic Tunnel Junction (MTJ) in series with a Field Effect Transistor (FET) which is gated by a Word Line (WL). A Bit Line (BL) is connected to the MTJ and runs perpendicular to the WL. A Source Line (SL) is connected to the FET and may run parallel to, and at the same pitch as, the BL.

Alternatively, the SL may be common to all cells within a region of the array, in what is known as a Common Source Line (CSL) configuration. See, for example, Zhao et al., "Architecting a common-source-line array for bipolar non-volatile memory devices," 2012 Design, Automation & Test in Europe Conference & Exhibition (DATE), pgs. 1451-1454 (March 2012). The CSL configuration is much preferred as it eliminates the need for SLs to run through the array parallel to, and at the same pitch as, the BLs. It also reduces the need for SL support circuits. However, the CSL configuration places limitations on the methods used to write the cell, as all cells within that region share the same SL.

In standby, the WL, BL, and SL are held to ground. One cell along the BL is selected by raising its WL. When a sufficiently large voltage is forced across the cell from BL to SL, the selected MTJ is written to a particular (i.e., parallel or anti-parallel) state. The written state is determined by the polarity of this voltage (BL high versus SL high).

When the cell is in the parallel or P state, the resistance (R) of the MTJ is lower than when in the anti-parallel or AP state. Representative values might be $R_P$=10 KΩ and $R_{AP}$=20KΩ. The selected cell is read by sensing the resistance from BL to SL. The sensing or read voltage needs to be much lower than the write voltage to avoid disturbing the cell. The state-dependent change in resistance is characterized by the parameter magnetoresistance or MR, which is defined as $MR=(R_{AP}-R_P)/R_P$. For example, 100% is a typical nominal value for MR although higher values have been reported.

For read, the selected BL current is sensed while forcing the BL to Vread, perhaps 100 mV above the SL which is held to ground. The data cell current is typically compared to a reference current to determine the state of the cell. A common method of generating this reference current is through the use of reference cells, which have been preprogrammed to specific states and which are configured so as to produce a reference current roughly midway between the two nominal data state currents.

Conventional reference configurations, however, have some notable drawbacks in terms of symmetry between the data and reference sides. This mismatch prohibits the use of certain advantageous sensing techniques.

Therefore, improved STT MRAM reference cell configurations would be desirable.

SUMMARY OF THE INVENTION

The present invention provides improved Spin Torque Transfer (STT) Magnetoresistive Random Access Memory (MRAM) midpoint reference cell configurations which permit reference cells to be written under conditions identical to that of writing data cells. In one aspect of the invention, a STT MRAM midpoint reference cell is provided. The STT MRAM midpoint reference cell includes: a plurality of word lines having at least one write reference word line and at least one read reference word line; a plurality of bit lines perpendicular to the word lines; at least one source line perpendicular to the bit lines; at least one first magnetic tunnel junction in series with i) a first field effect transistor gated by the write reference word line and ii) a second field effect transistor gated by the read reference word line; and at least one second magnetic tunnel junction in series with iii) a third field effect transistor gated by the write reference word line and iv) a fourth field effect transistor gated by the read reference word line.

A method of operating a STT MRAM midpoint reference cell is provided. The method includes: preprogramming the STT MRAM midpoint reference cell with a particular data state, wherein the STT MRAM midpoint reference cell includes: a plurality of word lines having at least one write reference word line and at least one read reference word line; a plurality of bit lines perpendicular to the word lines; at least one source line perpendicular to the bit lines; at least one first magnetic tunnel junction in series with i) a first field effect transistor gated by the write reference word line and ii) a second field effect transistor gated by the read reference word line; at least one second magnetic tunnel junction in series with iii) a third field effect transistor gated by the write reference word line and iv) a fourth field effect transistor gated by the read reference word line; reading the STT MRAM midpoint reference cell to determine a reference cell current; and comparing the reference cell current with a data cell current from a data cell to determine a state of the data cell.

A more complete understanding of the present invention, as well as further features and advantages of the present invention, will be obtained by reference to the following detailed description and drawings.

DETAILED DESCRIPTION OF PREFERRED EMBODIMENTS

Provided herein are improved Spin Torque Transfer (STT) Magnetoresistive Random Access Memory (MRAM) midpoint reference cell configurations which advantageously permit reference cells to be written under conditions identical to that of writing data cells, which is what is referred to herein as a "full write" or "data-like write" reference cell. The significance is that many midpoint reference cell configurations involve two magnetic tunnel junctions in series during the programming or write operation and, as a result, the write of the reference cells is less robust than that of data cells where only one magnetic tunnel junction is in series. As described above, when reading data from the data cell, a sense amplifier (SA) typically compares the data cell current to a reference current to determine the state of the cell. The reference current is generated using reference cells which have been pre-programmed to specific states and are configured to produce a reference current roughly midway (at the midpoint) between the two nominal data state currents, i.e., the parallel or P state, and the anti-parallel or AP state. This method provides excellent data to reference matching of many process, voltage, and temperature (PVT) parameters. Many STT MRAM reference cell configurations have been proposed. See, for example, Na et al., "Reference-Scheme Study and Novel Reference Scheme for Deep Submicrometer STT-RAM," IEEE Transactions on Circuits and Systems—I: Regular Papers, vol. 61, no. 12, pgs. 3376-3385 (December 2014) (hereinafter "Na"), the contents of which are incorporated by reference as if fully set forth herein.

In one configuration, two reference cells which are i) physically identical to the data cells and ii) preprogrammed to either state are current-sensed similarly to the data cell. See, for example, U.S. Pat. No. 6,600,690 issued to Nahas et al., entitled "Sense Amplifier for a Memory Having at Least Two Distinct Resistance States" and U.S. Pat. No. 6,946,882 issued to Gogl et al., entitled "Current Sense Amplifier," the contents of each of which are incorporated by reference as if fully set forth herein. The average of the two reference cell currents is generated within the SA and compared to the data cell current. The reference cells may be arranged along reference BLs or reference WLs. However, a drawback of this method is that the SA is required to have three-way symmetry, involving the data and two reference legs. This inherently limits the sensing methods that may be employed.

A partial solution to this problem is described, for example, in U.S. Pat. No. 9,343,131 issued to DeBrosse et al., entitled "Mismatch and Noise Insensitive Sense Amplifier Circuit for STT MRAM" (hereinafter "U.S. Pat. No. 9,343,131"), the contents of which are incorporated by reference as if fully set forth herein. However, the reference legs are operated far from the critical decision point (which is near the midpoint between $R_P$ and $R_{AP}$), and thus there is a resulting loss of SA accuracy.

In other reference cell configurations, four reference Magnetic Tunnel Junctions (MTJs) or cells (MTJ+a Field Effect Transistor (FET)) are combined in a parallel-series combination to effectively create a midpoint reference cell. The cells are pre-programmed to create a Current Mean (CM) or Resistance Mean (RM) value. Arguments exist for and against each value but in either case these techniques have several notable drawbacks. For instance, due to the series nature of the reference MTJs, they are programmed under diminished write bias conditions relative to the data cells. Furthermore, the layout of these reference cells disturbs the regular pattern of the array. At more advanced nodes, such modification of the regular array pattern may not be possible or may degrade the critical matching characteristics of the reference cells. For example, all the midpoint reference cell configurations described in Na require an inter-level via at the same level as the MTJ within the reference cell region.

Provided herein are improved STT MRAM midpoint reference cell configurations. These configurations provide notable advantages. First, they permit the reference MTJs to be programmed under write bias conditions identical to that of the data MTJs. Second, the layout changes required to implement the reference cell region involve modest changes to levels well before the MTJ is formed. Thus implementation of the present design is easily integrate-able with existing STT MRAM layouts using current fabrication technology.

Figure 1:
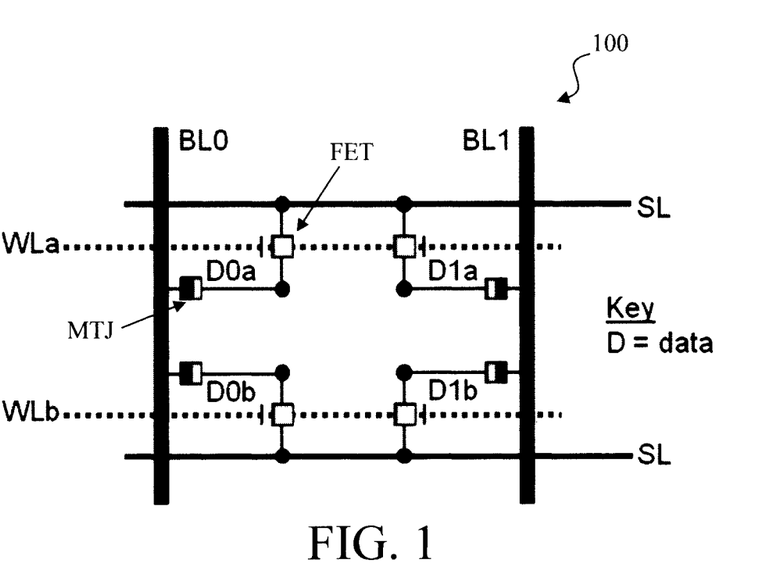
FIG. 1 is a schematic diagram of a data cell region according to an embodiment of the present invention.

FIG. 1 is a schematic diagram 100 of a STT MRAM data cell region in accordance with the present techniques. This schematic is repeated in both dimensions to create a data array. As shown in FIG. 1, each data cell (D0a,b, D1a,b, etc.) includes an MTJ in series with a FET. In practice, the MTJ is implemented in top layers of the cell and the FET is implemented below the MTJ in bottom layers of the cell. See, for example, U.S. patent application Ser. No. 15/145,364 by Daniel C. Worledge, entitled "Spin Hall Effect MRAM with Self-Reference Read," the contents of which are incorporated by reference as if fully set forth herein. Thus, when reference is made herein to an overlying or underlying MTJ or FET, it is with the understanding that the fabricated circuit generally includes the MTJ on top of the FET. Further, the MTJ and the FET may be offset from one another. Specifically, when the fabricated cell is viewed from the top down, the MTJ may not be aligned over the FET, but rather the FET is offset to one side of the MTJ.

Each FET is gated by a Word Line (WL), i.e., WLa, WLb, etc. A Bit Line (BL), i.e., BL0, BL1, etc., is connected to each of the MTJs and runs perpendicular to the WLs. A Source Line (SL) is connected to each of the FETs and runs perpendicular to the BLs. In this example, the SLs at the top and bottom of the figure are shared between adjacent instances in the vertical dimension. For instance, the top SL is common to D0a and D1a, and the bottom SL is common to D0b and D1b.

An exemplary SL array biasing scheme that may be used in accordance with the present techniques is described, for example, in commonly owned U.S. patent application Ser. No. 15/251,518, entitled "Improved STT MRAM Common Source Line Array Bias Scheme," by DeBrosse, the contents of which are incorporated by reference as if fully set forth herein. An exemplary SL configuration that may be used in accordance with the present techniques is described, for example, in commonly owned U.S. patent application Ser. No. 15/251,564, entitled "Improved STT MRAM Source Line Configuration," by DeBrosse, the contents of which are incorporated by reference as if fully set forth herein.

Figure 2:
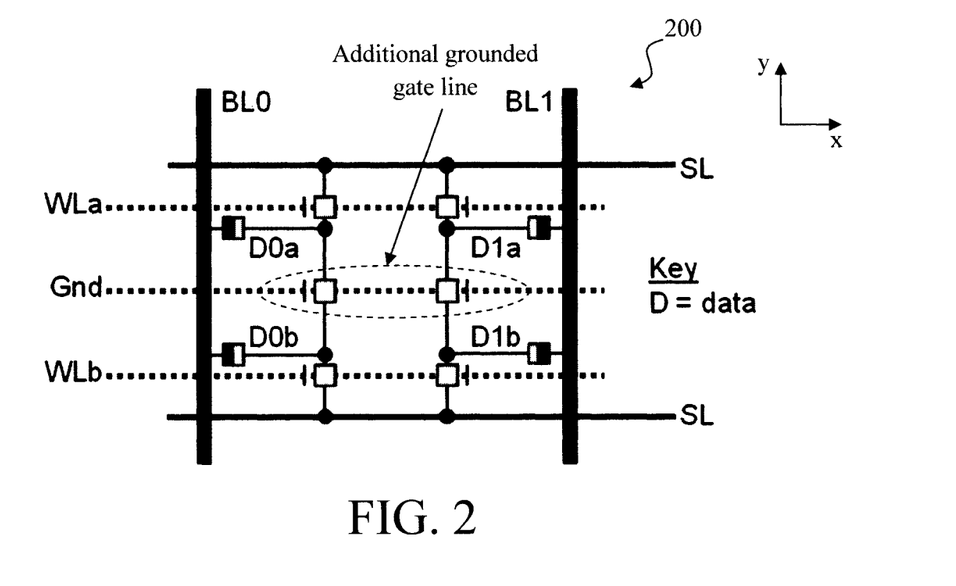
FIG. 2 is a schematic diagram of a variant of the data cell region having grounded Field Effect Transistor (FET) gates to isolate adjacent cells and offset Magnetic Tunnel Junctions (MTJs) for uniform gate and MTJ pitches according to an embodiment of the present invention.

FIG. 2 is a schematic diagram 200 of the data cell region with two changes relative to the layout of FIG. 1. First, a grounded (Gnd) gate is now being used to isolate adjacent data cell nodes along the vertical (y-axis) dimension. For instance, in the present example, the grounded gate isolates data cell D0a from data cell D0b, and data cell D1a from data cell D1b. This allows both the active area and gate levels to be simple, uniform pitch, line-space patterns within the array, which is very attractive from a lithography perspective. Thus, for the sake of a uniform patterning process, this additional grounded gate line can be introduced into the data cell layout without consequence because, in practice, this additional gate line is always turned off.

Second, the MTJs are drawn somewhat offset along the vertical (y-axis) dimension relative to the underlying (FET) gates. This allows the MTJs to be on a simple, uniform pitch along the vertical (y-axis) dimension and is easily accomplished within the stack of vias and metal landing pads connecting the FET to the MTJ. In this configuration, two MTJ pitches along the vertical (y-axis) dimension equate to three (FET) gate pitches. Hence, the MTJ pitch equals 1.5 gate pitches in the vertical (x-axis) dimension.

Figure 3:
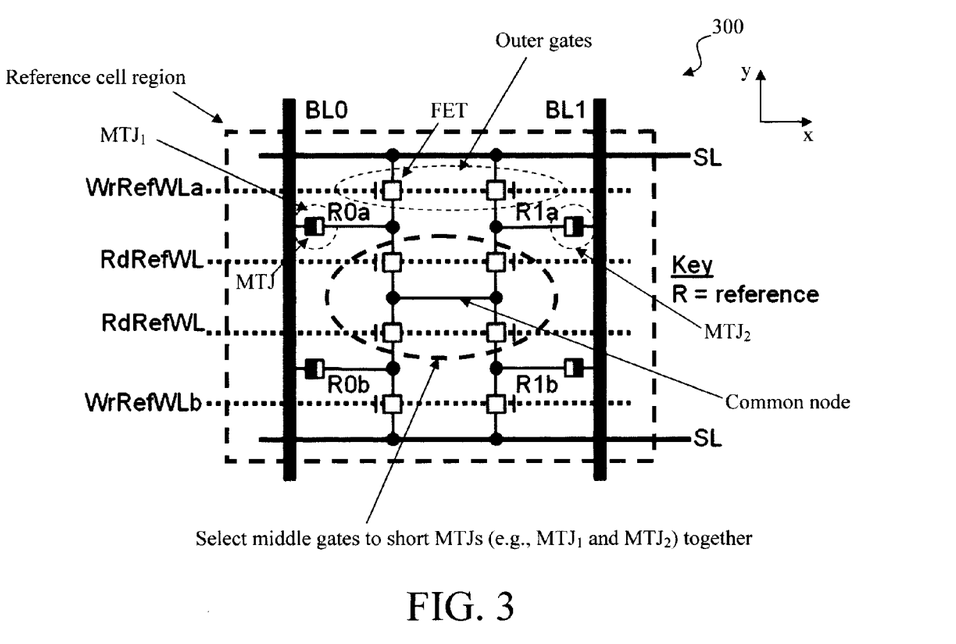
FIG. 3 is a schematic diagram of an exemplary reference cell region according to an embodiment of the present invention.

FIG. 3 is a schematic diagram 300 of an exemplary reference cell region in accordance with the present techniques. As will be described in detail below, during read, the state of the cell is determined by comparing a data cell current to a reference current from the reference cell region. The reference cells are preprogrammed to specific states and produce a reference read current at the midpoint between $R_P$ and $R_{AP}$. As with the data cells described above, in the reference cell region each FET is gated by a Word Line (WL), i.e., RdRefWL, WrRefWLa, etc. A Bit Line (BL), i.e., BL0, BL1, etc., is connected to each of the MTJs and runs perpendicular to the WLs. A Source Line (SL) is connected to each of the FETs and runs perpendicular to the BLs.

Each reference cell region shown in FIG. 3 is a composite of reference cells (i.e., MTJ+FET). Each reference cell region includes four MTJs and eight FETs. The middle gates are the Read Reference WL (RdRefWL) which, when selected, short the cell nodes of the reference MTJs (e.g., $MTJ_1$ and $MTJ_2$ in the case of the upper reference cell region) together. See FIG. 3. Specifically, the four RdRefWL-gated FETs connect the lower terminals of the four reference MTJs (R0a, R0b, R1a, and R1 b) to a common node (in the center of FIG. 3). The outer gates are the Write Reference WLs (WrRefWLa for the top reference cell region and WrRefWLb for the bottom reference cell region). The outer gates are used to (preprogram) the reference MTJs (e.g., $MTJ_1$ and $MTJ_2$ in the case of the upper reference cell region) to specific known states.

In FIG. 3, a top one of the reference cell regions is shown highlighted with dashes. The bottom reference cell region is essentially the mirror image of the top reference cell region and, as described in detail below, the top reference cell region and the bottom reference cell region operate in the same manner.

Thus, as shown in FIG. 3, each reference cell region includes at least one (first) MTJ (e.g., R0a) in series with i) a first FET (outer gate) gated by the write reference word line (WrRefWL) and ii) a second FET (middle gate) gated by the read reference word line (RdRefWL), and at least one (second) MTJ (e.g., R1 a) in series with iii) a third FET (outer) gated by the write reference word line (WrRefWL) and iv) a fourth FET (middle gate) gated by the read reference word line (RdRefWL). The first and second MTJs are connected to separate bit lines. The first, second, third, and fourth FET are connected to the source line.

Figure 4:
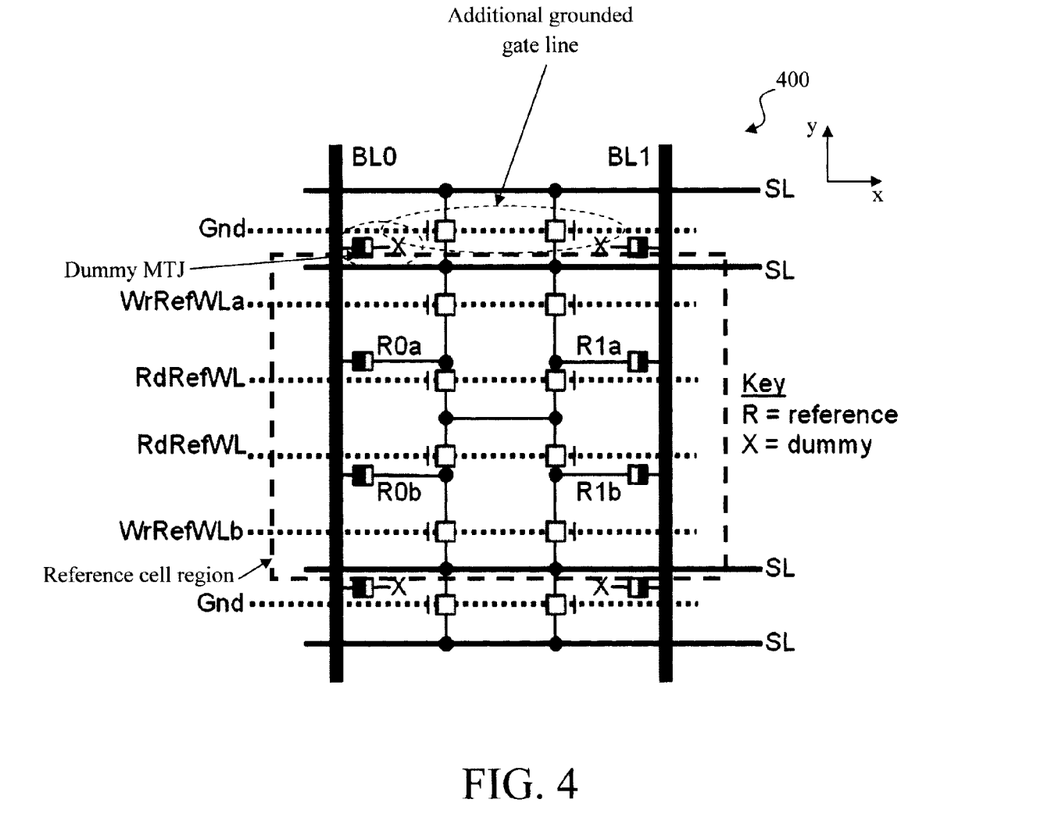
FIG. 4 is a schematic diagram of another exemplary reference cell region with dummy structures and MTJs offset for uniform gate and MTJ pitches according to an embodiment of the present invention.

FIG. 4 is a schematic diagram 400 of an exemplary reference cell region with two changes relative to the layout of FIG. 3. First, an additional gate, an additional SL, and an additional row of MTJs are added to each reference cell region.

The additional rows of MTJs are designated as X or dummy because, while they are connected to the BL, they are not connected to the FETs of the reference cells. Creating dummy MTJs (dummy MTJs not connected to the FET) is easily accomplished during fabrication of the device simply by omitting the wiring (i.e., the vias and/or metal landing pads) normally used to connect the FET to the MTJ. Including these rows of dummy MTJs in the layout advantageously allows for a simple, uniform pitch, line-space patterns within the array, which is very attractive from a lithography perspective. Thus, for the sake of a uniform patterning process, these rows of dummy MTJs can be introduced into the reference cell layout without consequence because, in practice, they are not ever connected to a FET.

Similarly, the additional line of grounded gates permits uniform pitch, line-space patterns. Thus, for the sake of a uniform patterning process, this additional grounded gate line can be introduced into the reference cell layout without consequence because, in practice, this additional gate line is always turned off. One advantage of adding another line can be understood by comparing the schematics in FIG. 2 and FIG. 3. Referring first to FIG. 2, each unit of data cells includes 2 MTJs and 3 gate pitches in the vertical dimension. The electrically necessary parts of the reference cell include 2 MTJs and 4 gate pitches. See FIG. 3. Since these are different MTJ/gate ratios (i.e., 2/3 does not equal 2/4) if one simply grafts the required reference block onto the data array, the gate and MTJ patterns cannot be simple regularly repeating patterns. However, by adding 2 dummy gates and 2 dummy MTJs (1 above+1 below as shown in the schematic in FIG. 4) the reference block is boosted to 4 MTJs and 6 gate pitches which is the same ratio as the data array (2/3 does equal 4/6). The inner two SLs are needed to write the reference cells. The outer two SLs are needed because, referring to FIG. 2, the top and bottom edge of the unit block is a shared SL. The reference block needs to be terminated with a SL so that it will seamlessly merge with the data array.

Second, the MTJs are drawn somewhat offset in the vertical dimension relative to the underlying gates (same as what was done in FIG. 2 for the data cell region). As described above, this allows the MTJs to be on a simple, uniform pitch in the vertical dimension. In this configuration, four MTJ pitches in the vertical dimension equate to six gate pitches. Like the data cell region, the MTJ pitch equals 1.5 gate pitches in the vertical dimension.

In FIG. 4, as above, a top one of the reference cell regions is shown highlighted with dashes. The bottom reference cell region is essentially the mirror image of the top reference cell region. The top reference cell region and the bottom reference cell region operate in the same manner.

In both the configurations shown in FIG. 3 and in FIG. 4, the reference cell regions are bounded on top and bottom by SLs. The SLs are common to all cells (MTJ+FET) within a reference cell region, i.e., a CSL configuration. Further, as shown in FIG. 3 and in FIG. 4, these common SLs may be shared between adjacent data and reference cell regions.

Figure 5:
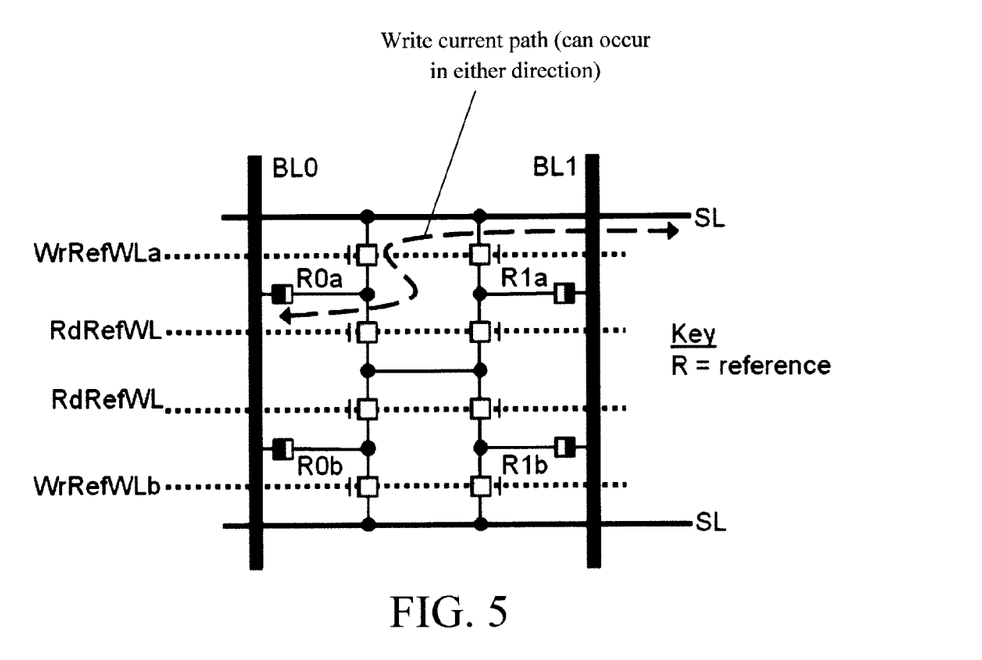
FIG. 5 is a schematic diagram illustrating programming of the present reference cells according to an embodiment of the present invention.
Figure 6:
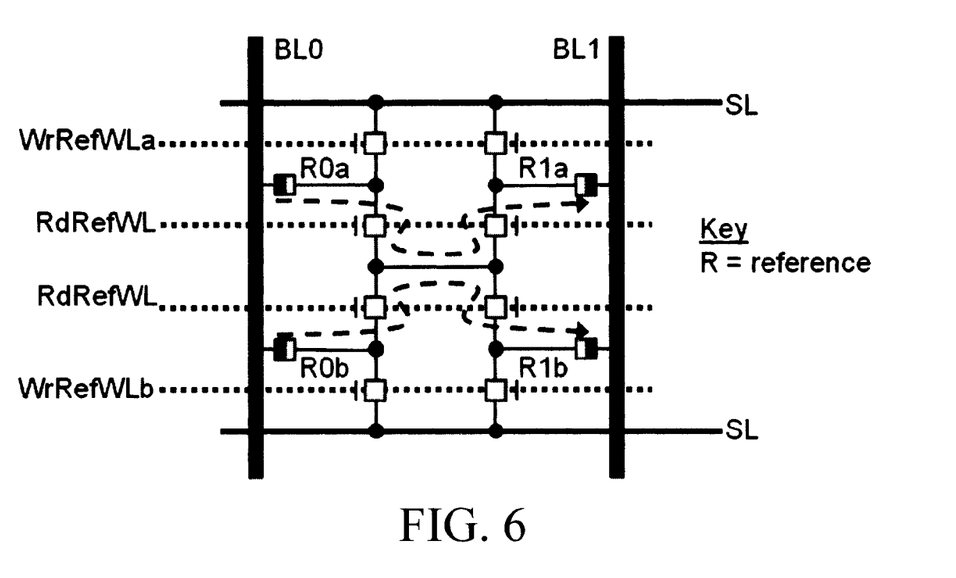
FIG. 6 is a schematic diagram illustrating use of the present reference cells for sensing according to an embodiment of the present invention.
Figure 7:
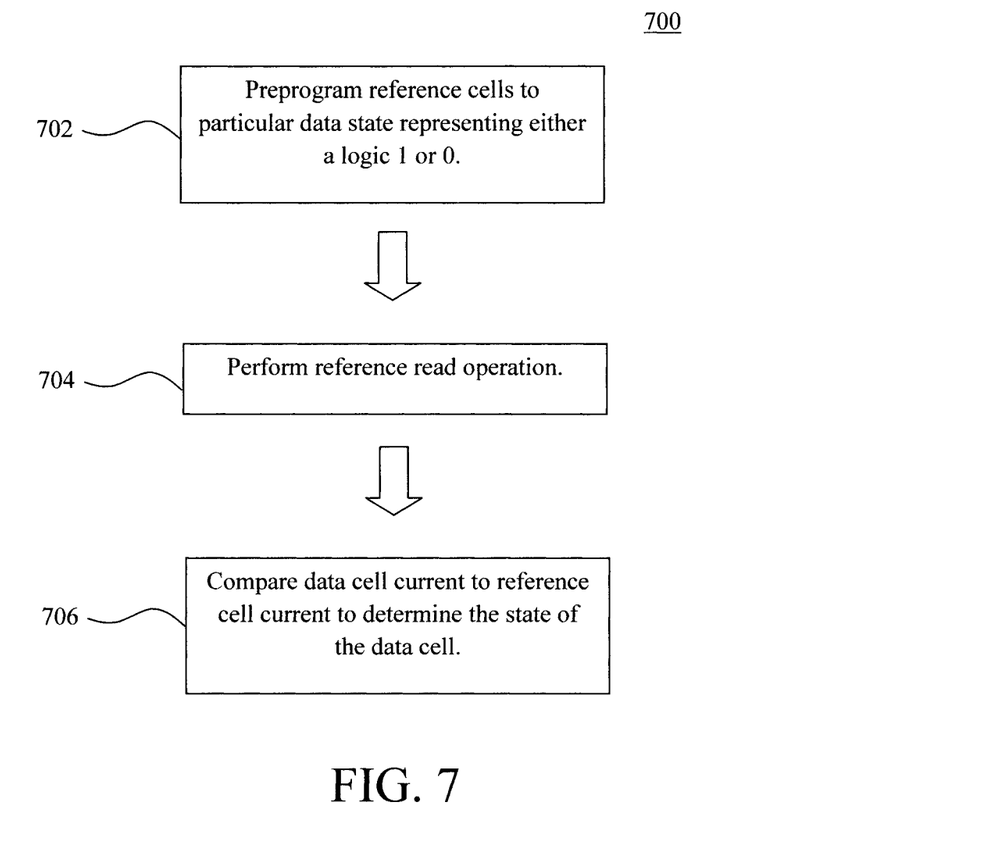
FIG. 7 is a diagram illustrating an exemplary methodology for reference cell operation according to an embodiment of the present invention.

The reference cell operation is now described by way of reference to FIG. 5 (reference cell programming), FIG. 6 (use of the reference cell for sensing), and methodology 700 of FIG. 7. Specifically, in step 702 of methodology 700 the reference cells are preprogrammed (i.e., written) to a particular data state, either a parallel (P) or anti-parallel (AP) orientation representing a logic 1 or 0, respectively.

The programming the reference cells in step 702 is shown illustrated in FIG. 5. It is notable that while FIG. 5 illustrates the programming operation in conjunction with the reference cell layout from FIG. 3, the same general operation applies to the modified reference cell design shown in FIG. 4.

As shown in FIG. 5, the four reference MTJs, designated as R0a, R0b, R1a, and R1b based on their BL and WrRefWL assignments can each be written under conditions identical to that of writing a data cell. Specifically, the write current path (as illustrated by the dashed arrow in FIG. 5) is BL to MTJ to FET to SL or the opposite (i.e., SL to FET to MTJ to BL). Four cycles are required to program the four reference MTJs wherein one MTJ is written in each cycle. For instance, in standby the WL, BL, and SL are all held to ground. In a given write cycle, one cell along the BL is selected by raising its WL, and then forcing a large voltage across the cell from BL to SL. This will write the MTJ in the selected cell to a particular data state, i.e., parallel (P) or anti-parallel (AP) orientation of the magnetic layers in the MTJ representing a logic 1 or 0, respectively, depending on the polarity of the voltage across the BL and SL, i.e., BL high versus SL high (e.g., for MTJ with free layer on top of fixed layer BL high writes 0 or P state and vice versa, or the opposite for MTJs with the free layer on the bottom of the fixed layer). For instance, using the exemplary reference cell of FIG. 3, a (first) MTJ R0a is selected using the (left side) FET on the WrRefWLa, and a voltage is forced across MTJ R0a from BL0 to the SL to write the MTJ R0a to either a logic 1 or 0 depending on the polarity of the voltage across the BL and SL. Next, a (second) MTJ R1a is selected using the other corresponding (right side) FET on the WrRefWLa, and a voltage is forced across MTJ R1a from BL1 to the SL to write the MTJ R1a to either a logic 1 or 0 depending on the polarity of the voltage across the BL and SL. This process is iterated until all four cells are written.

During the write, each of the four reference MTJs can be programmed to either data state, 1 or 0. According to an exemplary embodiment, one MTJ along a given WrRefWL is written to a logic 0 and the other MTJ along the same WrRefWL is written to a logic 1. For instance, as shown in FIG. 5, in the top reference cell R0a along WrRefWLa is written to a logic 0, while R1a also along WrRefWLa is written to a logic 1. Similarly, in the bottom reference cell R0b along WrRefWLb is written to a logic 0, while R1b also along WrRefWLb is written to a logic 1. That way, during read, the sum of the read currents will be at the midpoint between 0 and 1.

In step 704 of methodology 700 a read operation of the reference cells is performed. The reference read operation of step 704 is shown illustrated in FIG. 6. Again, it is notable that while FIG. 6 illustrates the reference read operation in conjunction with the reference cell layout from FIG. 3, the same general operation applies to the modified reference cell design shown in FIG. 4.

As shown in FIG. 6, both RdRefWLs (i.e., both RdRefWLa and RdRefWLb) are selected. The BL0 is forced by the SA to Vread, establishing current through cell R0a in parallel with cell R0b, that combination being in series with cells R1a and R1b, respectively, in parallel. The current flow and direction of current flow through R0a/R1a and R0b/R1b is indicated by dashed arrows. BL1 is held to ground, similar to the SL and all unselected BLs. Depending on the assignments of the R0a, R0b, R1a and R1b data states, either the CM or RM value of reference resistance may be achieved. For instance:

|     | RM | CM |
|-----|----|----|
| R0a | 0  | 0  |
| R0b | 0  | 1  |
| R1a | 1  | 0  |
| R1b | 1  | 1  |

Programming is as shown above. The ability of this approach to program either value (CM or RM) is an advantage. In addition to the weaker write, some midpoint approaches only allow one or the other.

In step 706, the data cell (see FIGS. 1 and 2, described above) current is then compared to the reference cell (see FIGS. 3 and 4, described above) current to determine the state of the data cell. By way of example only, this can be accomplished using a comparator as described, for example, in U.S. Pat. No. 9,343,131. As described in U.S. Pat. No. 9,343,131, the comparator has two input nodes. An n-channel transistor is connected to a p-channel transistor at each of the nodes. A multiplexer is configured to selectively connect the data or reference cell to the n-channel transistor at each of the nodes. The comparator then outputs the data state (e.g., 1 or 0) of the data cell based on input of a voltage at one of the input nodes and an input voltage at the other input node. See U.S. Pat. No. 9,343,131.

Figure 8:
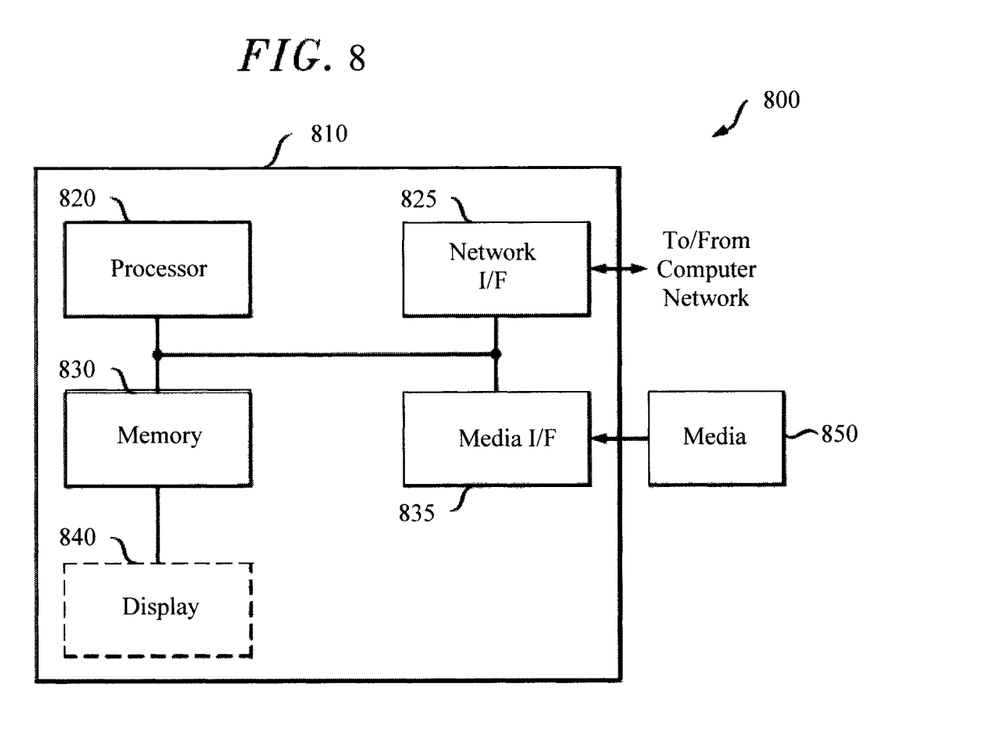
FIG. 8 is a diagram illustrating an exemplary apparatus for implementing the present techniques according to an embodiment of the present invention.

Turning now to FIG. 8, a block diagram is shown of an apparatus 800 in which the present techniques may be implemented and/or which may be used for implementing one or more of the methodologies presented herein. By way of example only, apparatus 800 can be configured to implement one or more of the steps of methodology 700 of FIG. 7.

Apparatus 800 includes a computer system 810 and removable media 850. Computer system 810 includes a processor device 820, a network interface 825, a memory 830, a media interface 835 and an optional display 840. Network interface 825 allows computer system 810 to connect to a network, while media interface 835 allows computer system 810 to interact with media, such as a hard drive or removable media 850.

Processor device 820 can be configured to implement the methods, steps, and functions disclosed herein. The memory 830 could be distributed or local and the processor device 820 could be distributed or singular. The memory 830 could be implemented as an electrical, magnetic or optical memory, or any combination of these or other types of storage devices. Moreover, the term "memory" should be construed broadly enough to encompass any information able to be read from, or written to, an address in the addressable space accessed by processor device 820. With this definition, information on a network, accessible through network interface 825, is still within memory 830 because the processor device 820 can retrieve the information from the network. It should be noted that each distributed processor that makes up processor device 820 generally contains its own addressable memory space. It should also be noted that some or all of computer system 810 can be incorporated into an application-specific or general-use integrated circuit.

Optional display 840 is any type of display suitable for interacting with a human user of apparatus 800. Generally, display 840 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A Spin Torque Transfer (STT) Magnetoresistive Random Access Memory (MRAM) midpoint reference cell, comprising:
   a plurality of word lines comprising at least one write reference word line and at least one read reference word line;
   at least one grounded gate line;
   a plurality of bit lines perpendicular to the word lines;
   at least one source line perpendicular to the bit lines;
   at least one first magnetic tunnel junction in series with i) a first field effect transistor gated by the write reference word line and ii) a second field effect transistor gated by the read reference word line; and
   at least one second magnetic tunnel junction in series with iii) a third field effect transistor gated by the write reference word line and iv) a fourth field effect transistor gated by the read reference word line.

2. The STT MRAM midpoint reference cell of claim 1, wherein the first magnetic tunnel junction and the second magnetic tunnel junction are connected to separate bit lines.

3. The STT MRAM midpoint reference cell of claim 1, wherein the first field effect transistor, the second field effect transistor, the third field effect transistor, and the fourth field effect transistor are connected to the source line.

4. The STT MRAM midpoint reference cell of claim 1, wherein the first magnetic tunnel junction is offset relative to the first field effect transistor and the second field effect transistor.

5. The STT MRAM midpoint reference cell of claim 1, wherein the second magnetic tunnel junction is offset relative to the third field effect transistor and the fourth field effect transistor.

6. The STT MRAM midpoint reference cell of claim 1, further comprising:
   at least one dummy magnetic tunnel junction.

7. The STT MRAM midpoint reference cell of claim 6, wherein the dummy magnetic tunnel junction is connected to one of the bit lines, but is not connected to a field effect transistor.

8. The STT MRAM midpoint reference cell of claim 1, further comprising:
   multiple source lines.

9. The STT MRAM midpoint reference cell of claim 1, wherein the first magnetic tunnel junction and the second magnetic tunnel junction are preprogrammed with a particular data state representing either a logic 1 or a logic 0.

10. A method of operating a STT MRAM midpoint reference cell, the method comprising:
    preprogramming the STT MRAM midpoint reference cell with a particular data state, wherein the STT MRAM midpoint reference cell comprises:
      a plurality of word lines comprising at least one write reference word line and at least one read reference word line;
      a plurality of bit lines perpendicular to the word lines;
      at least one source line perpendicular to the bit lines;
      at least one first magnetic tunnel junction in series with i) a first field effect transistor gated by the write reference word line and ii) a second field effect transistor gated by the read reference word line;
      at least one second magnetic tunnel junction in series with iii) a third field effect transistor gated by the write reference word line and iv) a fourth field effect transistor gated by the read reference word line;
    reading the STT MRAM midpoint reference cell to determine a reference cell current; and
    comparing the reference cell current with a data cell current from a data cell to determine a state of the data cell.

11. The method of claim 10, wherein the first magnetic tunnel junction and the second magnetic tunnel junction are connected to separate bit lines.

12. The method of claim 10, wherein the first field effect transistor, the second field effect transistor, the third field effect transistor, and the fourth field effect transistor are connected to the source line.

13. The method of claim 10, wherein the preprogramming of the STT MRAM midpoint reference cell comprises:
    selecting the first magnetic tunnel junction using the first field effect transistor gated by the write reference word line;
    forcing a voltage across the first magnetic tunnel junction from a corresponding one of the bit lines to the source line;
    selecting the second magnetic tunnel junction using the third field effect transistor gated by the write reference word line; and
    forcing a voltage across the second magnetic tunnel junction from another corresponding one of the bit lines to the source line.

14. The method of claim 13, wherein the first magnetic tunnel junction and the second magnetic tunnel junction are preprogrammed to a particular data state representing either a logic 1 or a logic 0.

15. The method of claim 10, wherein the reading of the STT MRAM midpoint reference cell comprises:
    selecting the write reference word line; and
    passing current through the first magnetic tunnel junction and the second magnetic tunnel junction in series using a corresponding one of the bit lines while other bit lines are held to ground.

16. The method of claim 10, wherein the STT MRAM midpoint reference cell further comprises:
    at least one grounded gate line.

17. The method of claim 10, wherein the first magnetic tunnel junction is offset relative to the first field effect transistor and the second field effect transistor.

18. The method of claim 10, wherein the second magnetic tunnel junction is offset relative to the third field effect transistor and the fourth field effect transistor.

19. The method of claim 10, wherein the STT MRAM midpoint reference cell further comprises:
    at least one dummy magnetic tunnel junction that is connected to one of the bit lines, but is not connected to a field effect transistor.

* * * * *